United States Patent
Shin et al.

(10) Patent No.: US 11,417,395 B2
(45) Date of Patent: Aug. 16, 2022

(54) PHASE CHANGE MEMORY SYSTEM, PHASE CHANGE MEMORY DEVICE, AND PHASE CHANGE MEMORY DEVICE REFRESH METHOD

(71) Applicant: Samsung Electronics Co., Ltd., Suwon-si (KR)

(72) Inventors: Yoon Sung Shin, Hwaseong-si (KR); Kwang Jin Lee, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 17/036,378

(22) Filed: Sep. 29, 2020

(65) Prior Publication Data

US 2021/0118500 A1   Apr. 22, 2021

(30) Foreign Application Priority Data

Oct. 18, 2019   (KR) .................. 10-2019-0129762

(51) Int. Cl.
*G11C 13/00* (2006.01)
*G06F 3/06* (2006.01)

(52) U.S. Cl.
CPC ........ *G11C 13/0033* (2013.01); *G06F 3/0604* (2013.01); *G06F 3/0646* (2013.01);
(Continued)

(58) Field of Classification Search
CPC ........... G11C 13/0004; G11C 13/0033; G11C 13/004; G11C 13/003; G11C 2213/72; G11C 2213/79; G11C 13/0064; G11C 13/0069; G11C 2029/0409; G11C 2029/0411; G11C 2213/82; G11C 29/028; G11C 29/52; G11C 7/04; G11C 16/10; G11C 16/3431; G11C 16/349; G11C 13/0009; G11C 13/0023; G11C 2013/0078; G06F 3/0604; G06F 3/0646; G06F 3/0673; G06F 12/0246; G06F 2212/1041; G06F 2212/7202; G06F 2212/7205; G06F 3/0611; G06F 3/0619; G06F 3/0625; G06F 3/0652; G06F 3/0679; G06F 11/1048;
(Continued)

(56) References Cited

U.S. PATENT DOCUMENTS 7,405,964 B2   7/2008 Philipp et al.
8,355,291 B2   1/2013 Kim et al.
(Continued)

*Primary Examiner* — Thong Q Le
(74) *Attorney, Agent, or Firm* — Harness, Dickey & Pierce, P.L.C.

(57) ABSTRACT

A phase change memory system comprises a phase change memory device which includes a plurality of memory units including a plurality of memory cells in units of at least one or more codewords and a phase change memory controller which performs a chip refresh operation for refreshing the entire phase change memory device, wherein the phase change memory device includes a setting circuitry which determines one of the plurality of memory units in a desired manner, a refresh controller which refreshes the decided memory unit, a sensing circuitry which senses data of at least one or more codewords included in the refreshed memory unit, and a request circuitry which requests a host for the chip refresh operation on the basis of a result of the sensing operation.

20 Claims, 13 Drawing Sheets

(52) U.S. Cl.
CPC ........ *G06F 3/0673* (2013.01); *G11C 13/0004* (2013.01); *G11C 13/004* (2013.01)

(58) Field of Classification Search
CPC .... G06F 11/1068; G06F 11/08; G06F 11/106; G06F 3/0629; G06F 3/0656
USPC ................. 711/103; 714/6.24, 721, 764, 768
See application file for complete search history.

(56) References Cited

U.S. PATENT DOCUMENTS

| | | |
|---|---|---|
| 8,572,333 B2 | 10/2013 | Confalonieri et al. |
| 9,070,473 B2 | 6/2015 | Bedeschi et al. |
| 9,257,175 B2 | 2/2016 | Pangal et al. |
| 9,952,781 B2 | 4/2018 | Orme et al. |
| 9,959,059 B2 | 5/2018 | Orme et al. |
| 2016/0189774 A1 | 6/2016 | Xie et al. |
| 2018/0061491 A1 | 3/2018 | Hong |
| 2018/0130526 A1 | 5/2018 | Hong et al. |
| 2019/0221273 A1* | 7/2019 | Parkinson ............. G06F 3/0619 |

* cited by examiner

PHASE CHANGE MEMORY SYSTEM, PHASE CHANGE MEMORY DEVICE, AND PHASE CHANGE MEMORY DEVICE REFRESH METHOD

This U.S. non-provisional application claims the benefit of priority to Korean Patent Application No. 10-2019-0129762, filed on Oct. 18, 2019, in the Korean Intellectual Property Office, the disclosure of which is incorporated herein in its entirety by reference.

BACKGROUND

1. Field

Various example embodiments of the inventive concepts relate to phase change memory systems, phase change memory devices, and/or methods for refreshing a phase change memory device.

2. Description

Memory cells may have a Set state value and/or a Reset state value in a phase change memory device using a variable resistance element (GST) and an access element (Ovonic Threshold Switch: OTS), based on and/or depending on a resistance value and/or a voltage value. Dispersion of the voltage to be applied to the memory cell moves in an increasing direction by the element characteristics, and this is defined as a drift phenomenon. An error may occur in a data sensing operation of the memory cells due to the drift phenomenon of the memory cell.

To reduce and/or prevent such an error, a refresh operation to increase the voltage dispersion to an original state may be performed. However, since the voltage value and the degree of drift that are the standard of sensing differ for each memory cell, the timing at which the refresh operation is desired and/or required to reduce and/or prevent a sensing error may differ for each memory cell. Therefore, a refresh operation that reflects the states of the memory cells is desired and/or required.

SUMMARY

Aspects of at least one example embodiment of the present inventive concepts provide a phase change memory system in which the possibility of an occurrence of a sensing error is low by reflecting a state of a memory cell in a phase change memory device and performing a refresh operation at an appropriate time.

Aspects of at least one example embodiment of the present inventive concepts also provide a phase change memory system which detects a memory unit in a memory device that shows a sensing error due to factors other than drift in the phase change memory device.

However, aspects of at least one example embodiment the present inventive concepts are not restricted to the ones set forth herein. The above and other aspects of at least one example embodiment the present inventive concepts will become more apparent to one of ordinary skill in the art to which the example embodiments of the present inventive concepts pertains by referencing the detailed description of the example embodiments of the present inventive concepts given below.

According to some aspects of at least one example embodiment of the present inventive concepts, there is provided a phase change memory system comprising a phase change memory controller configured to perform a chip refresh operation for refreshing a phase change memory device, the phase change memory device including a plurality of memory cells of least one or more codewords, the phase change memory device including control logic circuitry configured to determine a memory unit including at least one codeword in the plurality of memory cells, perform a refresh operation on the determined memory unit, perform a sensing operation on data of the memory unit, and request a chip refresh operation from a host based on a result of the sensing operation.

According to some aspects of at least one example embodiment of the present inventive concepts, there is provided a method of refreshing a phase change memory device comprising determining, using control logic circuitry, a memory unit including a plurality of codewords in a plurality of memory cells of a phase change memory device, performing, using the control logic circuitry, a refresh operation on the memory unit based on a sensing voltage for reading data stored in a first codeword of the plurality of codewords and a desired reference voltage, performing, using the control logic circuitry, a sensing operation on data of the plurality of codewords included in the memory unit, and performing, using the control logic circuitry, a refresh operation on the entire phase change memory device based on a result of the sensing operation.

According to some aspects of at least one example embodiment of the present inventive concepts, there is provided a phase change memory system comprising a phase change memory cell array including at least one codeword, a host including a phase change memory controller configured to perform a chip refresh operation for refreshing the entire phase change memory cell array, and control logic circuitry configured to sense data of the at least one codeword of the phase change memory cell array, and transmit a request the chip refresh operation to the host based on a result of the sensing.

Specific details of other aspects of the example embodiments are included in the detailed description and drawings.

BRIEF DESCRIPTION OF THE DRAWINGS

The above and other aspects and features of the example embodiments of the present inventive concepts will become more apparent by describing in detail example embodiments thereof with reference to the attached drawings, in which.

DETAILED DESCRIPTION

Hereinafter, various example embodiments of the present inventive concepts will be described with reference to the accompanying drawings.

Figure 1:
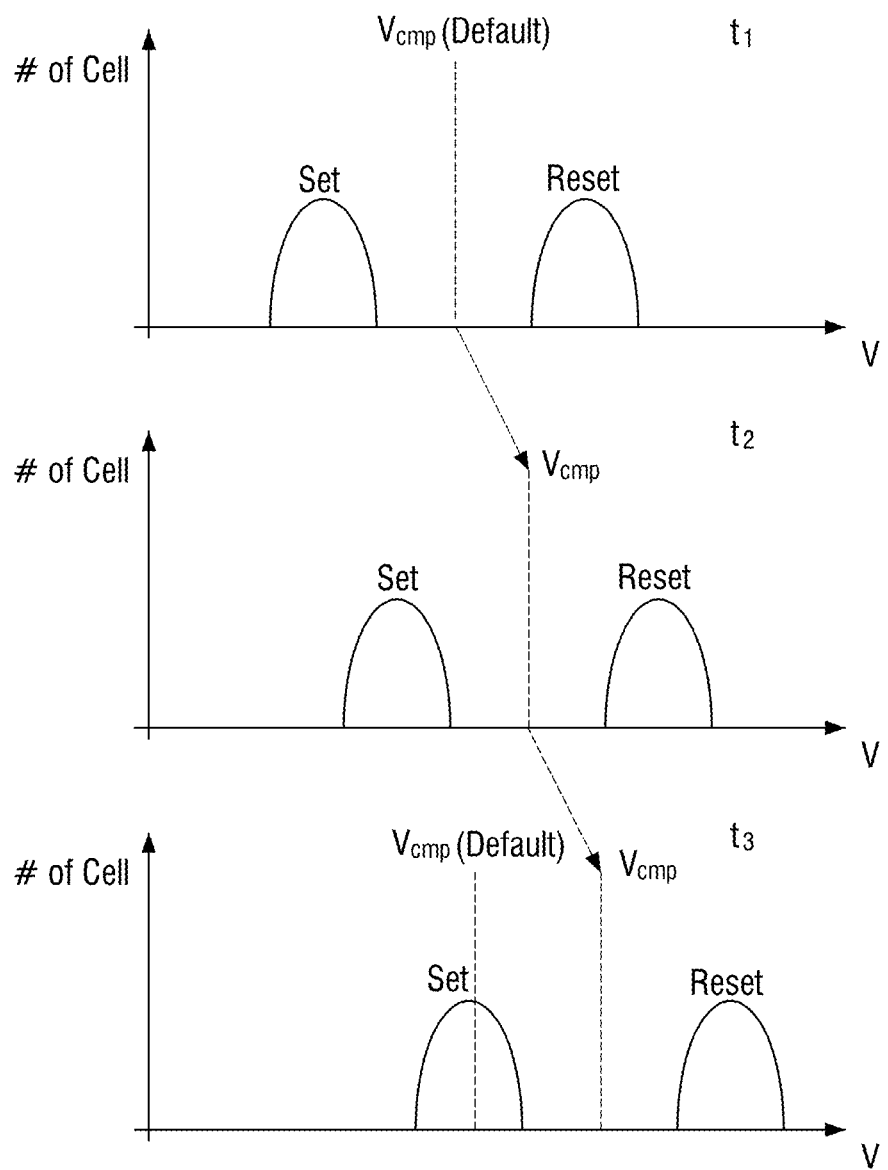
FIG. 1 is a diagram for explaining a change in dispersion of phase change memory cells due to a drift phenomenon according to at least one example embodiment.

FIG. 1 is a diagram for explaining a change in a dispersion of phase change memory cells due to a drift phenomenon according to at least one example embodiment. The phase change memory cell may store different data in accordance with the resistance value of the phase change material. The voltage value to be applied to the phase change memory cell also changes with a change in the resistance values.

For example, a phase change material changes to a crystalline state while being slowly cooled after heating and changes to an amorphous state while being rapidly cooled. A phase change material in the crystalline state has a low resistance, and a phase change material in the amorphous state has a high resistance.

Therefore, when a current and/or voltage is applied to a resistive material (e.g., the phase change material), a voltage applied to the phase change material of the crystalline state may be high, and a voltage applied to the phase change material of the amorphous state may be high. Accordingly, the crystalline state may be defined as set data or "0" data, and the amorphous state may be defined as reset data or "1" data, etc.

The voltage applied to the memory cell may be shown as a voltage dispersion of time $t_1$. If a lower voltage value is applied to the memory cell around a common intermediate point $V_{cmp}$ of the voltage dispersion at the initial time $t_1$, it is possible to determine that the set data or 0 data has been input to the memory cell. If a higher voltage value is applied, it is possible to determine that reset data or 1 data has been input to the memory cell. In other words, the memory cell may be read based on the voltage value applied to the memory cell, with a lower voltage value used to read a set data (e.g., 0 data) value, and a higher voltage value used to read a reset data (e.g., 1 data) value, etc. Further, the common intermediate point $V_{cmp}$ of the initial voltage dispersion may be utilized as the sensing voltage.

With a change in time, the temperature, the structure, and the like, of the phase change material may change. The resistance value of the phase change material of the phase change memory cell may change with the time change, or in other words, the resistance value of the phase change memory cell may change with time. As described above, consequently, the voltage dispersion of the memory cell may change due to the change in the resistance value. The factors thereof may include a temperature change of the phase change material, a structure relaxation process, and the like.

For example, while structural defects of the phase change material may be cured in accordance with time changes and/or continued operation of the phase change memory device, the resistance of the phase change material may also change with over time, and the voltage distribution applied to the memory cell, and the common intermediate point $V_{cmp}$ may therefore vary. Such a change in voltage dispersion may be referred to as drift.

As an example, with the time change from $t_1$ to $t_3$ as shown in FIG. 1, the dispersion of voltage of the memory cell changes in the increasing direction, or in other words the voltage may increase over time. However, the change manner of the voltage dispersion of the memory cell is not limited thereto, and a decreasing direction or the like may also be included. Although an increase in the voltage dispersion of the memory cell will be described below, the technical idea of the example embodiments of the present inventive concepts are not limited thereto, and may also be applied to a situation where the voltage dispersion of a memory cell decreases as well.

Although the voltage dispersion increases at $t_3$, if the standard of the data sensing is the same as the sensing voltage $V_{cmp}$ (e.g., Default) of the timing $t_1$, an error may occur in data sensing (e.g., a read operation, etc.) of the memory cell. Therefore, it is desired and/or necessary to reduce the possibility of occurrence of such an error.

Figure 2:
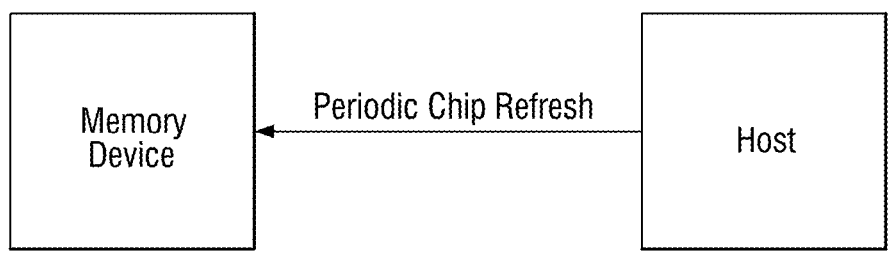
FIGS. 2 and 3 are diagrams for explaining a refresh operation according to a change in dispersion of phase change memory cells according to at least one example embodiment.
Figure 3:
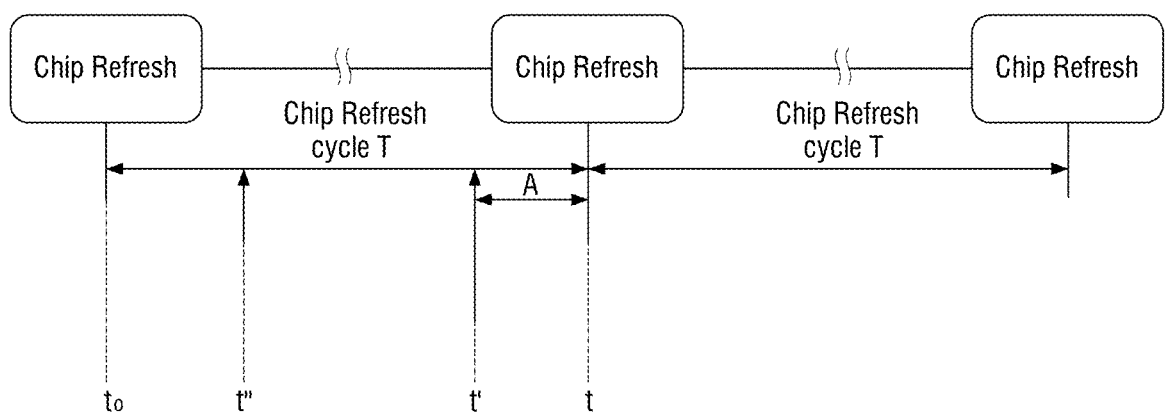

FIGS. 2 and 3 are diagrams for explaining a refresh operation according to a change in dispersion of phase change memory cells according to some example embodiments.

A method of reducing the possibility of occurrence of the error due to the drift includes a refresh operation. A voltage dispersion of the memory cell may be initialized by the refresh operation.

Since the chip refresh operation is executed by the host at a cycle T, the chip refresh operation is performed for the entire memory device, and the operation of the memory device is stopped while the chip refresh operation is being performed. If the chip refresh operation is executed again at timing t"(t"<<t) after executing an arbitrary chip refresh operation, the operation of the memory device may be stopped more than desired and/or necessary. As a result, the operation efficiency of the memory device may be degraded, slowed, and/or inefficient, etc.

Furthermore, the drift of the memory cell at t' earlier than the cycle T by the time A proceeds, and an error may occur in the data of many memory cells. In such a case, the memory device does not operate normally in the section [t', t], etc. Therefore, it may be desired and/or necessary to execute a chip refresh operation in consideration of the state of the memory cell, etc.

Figure 4:
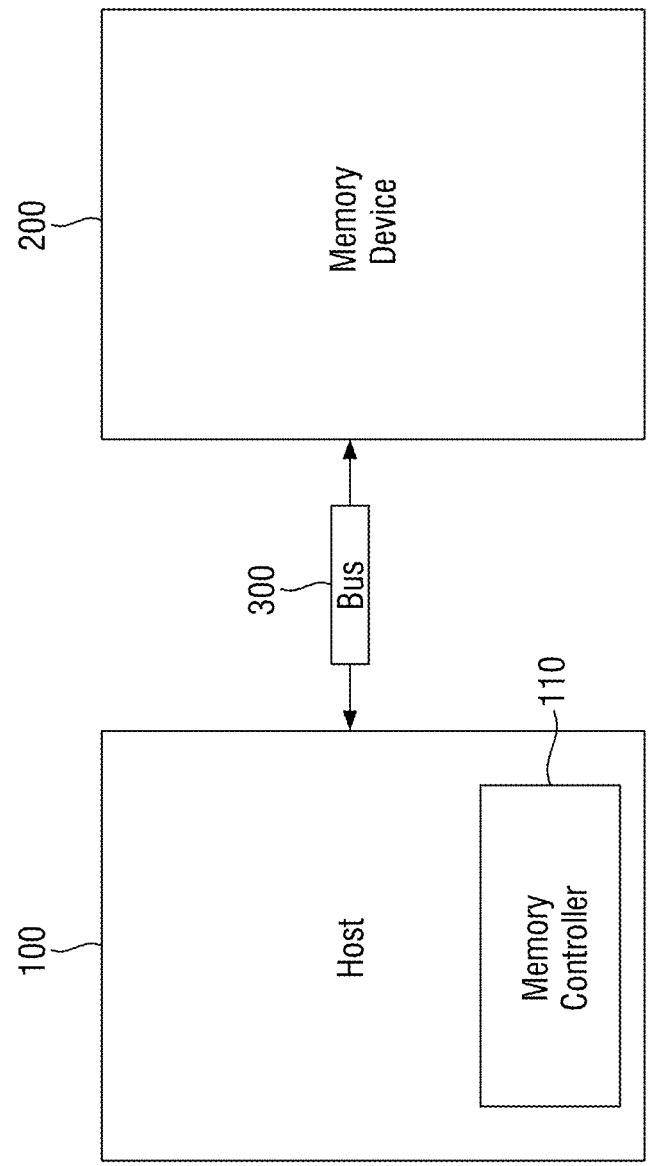
FIG. 4 is a block diagram schematically showing a system of a phase change memory device according to some example embodiments.

FIG. 4 is a block diagram schematically showing a phase change memory system according to some example embodiments. Referring to FIG. 4, the phase change memory system according to some example embodiments may include a host 100 and/or a memory device 200, but is not limited thereto, and the phase change memory system may include other constituent components as well. The host 100 may include a memory controller 110 that has an access authority and/or a read authority to the memory device 200, etc. A bus 300 for signal and data exchange may be provided between the host 100 and the memory device 200, etc.

The host 100 may execute various applications in accordance with a user's request. The host 100 may load and execute the applications in the memory device 200 to execute the application.

The host 100 may execute an operating system (OS), and may execute various software applications on the operating system (OS). For such an operation, the host 100 may write data on the memory device 200, read data, and/or erase stored in the memory device 200, etc.

In addition, the host 100 transmits a command CMD for the refresh operation of the memory device 200 through the memory controller 110, and a refresh operation may be performed on the entire memory cells of the memory device 200. In addition, the state of the memory device 200 and the refresh operation request may be read through the memory controller 110.

The memory device 200 may be a main memory of an electronic device, a secondary memory of the electronic device, etc. An operating system (OS), basic application programs, and the like, will be loaded into the memory device 200 when the electronic device is booted up.

For example, an OS image stored in a non-volatile memory (not shown) may be loaded into the memory device 200 on the basis of a booting sequence when the host 100 is booted up. All input and/or output operations of the host 100 may be supported by the operating system.

Similarly, application programs may be loaded into the memory device 200 for selection of the user and/or for providing basic services (e.g., background services, etc.). The memory device 200 may also be used as a buffer memory for storing video data to be provided from an image sensor such as a camera, etc.

The memory device 200 may be a phase change memory device (PRAM) capable of performing a byte access. The memory device 200 may also be provided as a non-volatile memory device capable of performing overwriting.

For example, the memory device 200 may be non-volatile RAM such as PRAM, Magnetoresistive RAM (MRAM), resistive RAM (ReRAM or RRAM), ferroreactive RAM (FRAM), and/or NOR flash memory, etc., but the example embodiments are not limited thereto. The memory device 200 stores an operating system (OS), at least one running application program, data, updated data, and the like, when the electronic device is executed and/or when the electronic device is powered off.

The memory device 200 may be provided in the form of a multi-chip package and/or a module in which memory multi-chips are stacked. However, the configuration method of the memory device 200 is not limited thereto, and although a case where the memory device 200 is a PRAM will be described below, the technical idea of the example embodiments of the present inventive concepts are not limited thereto.

The bus 300 may provide a transmission path for data and/or signals on the host 100 and/or the memory device 200. Although a single bus is shown in FIG. 4, the example embodiments are not limited thereto and a case of multiple buses may also be included. When there are multiple buses 300, it is possible to control the memory device 200 in accordance with a channel interleaving method, etc., a plurality of hosts and/or memory devices may communicate with each other, and/or the memory device 200 and the host 100 may independently transmit data over the multiple buses, etc.

Figure 5:
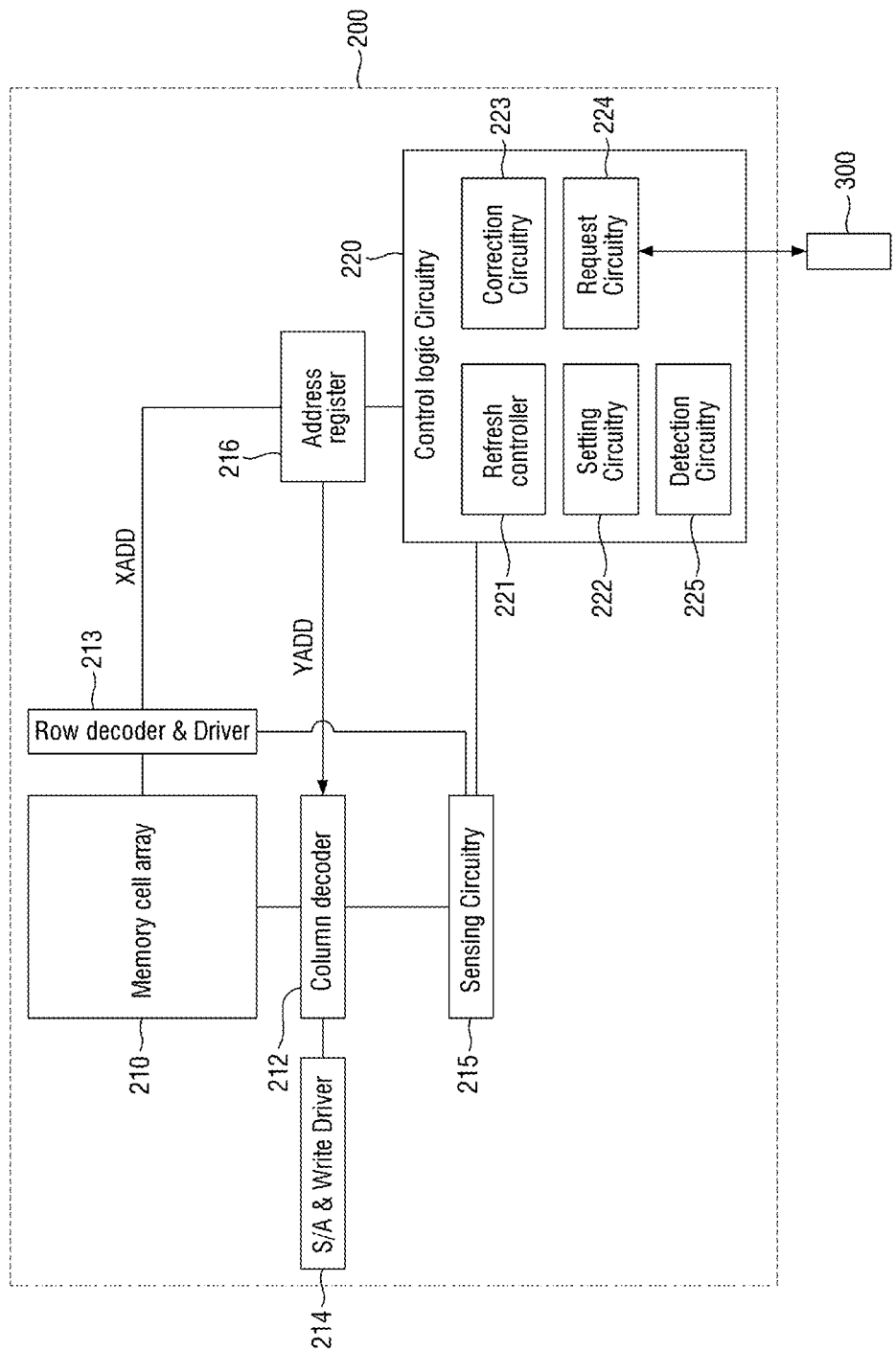
FIG. 5 is a block diagram schematically showing the phase change memory device according to some example embodiments.
Figure 6:
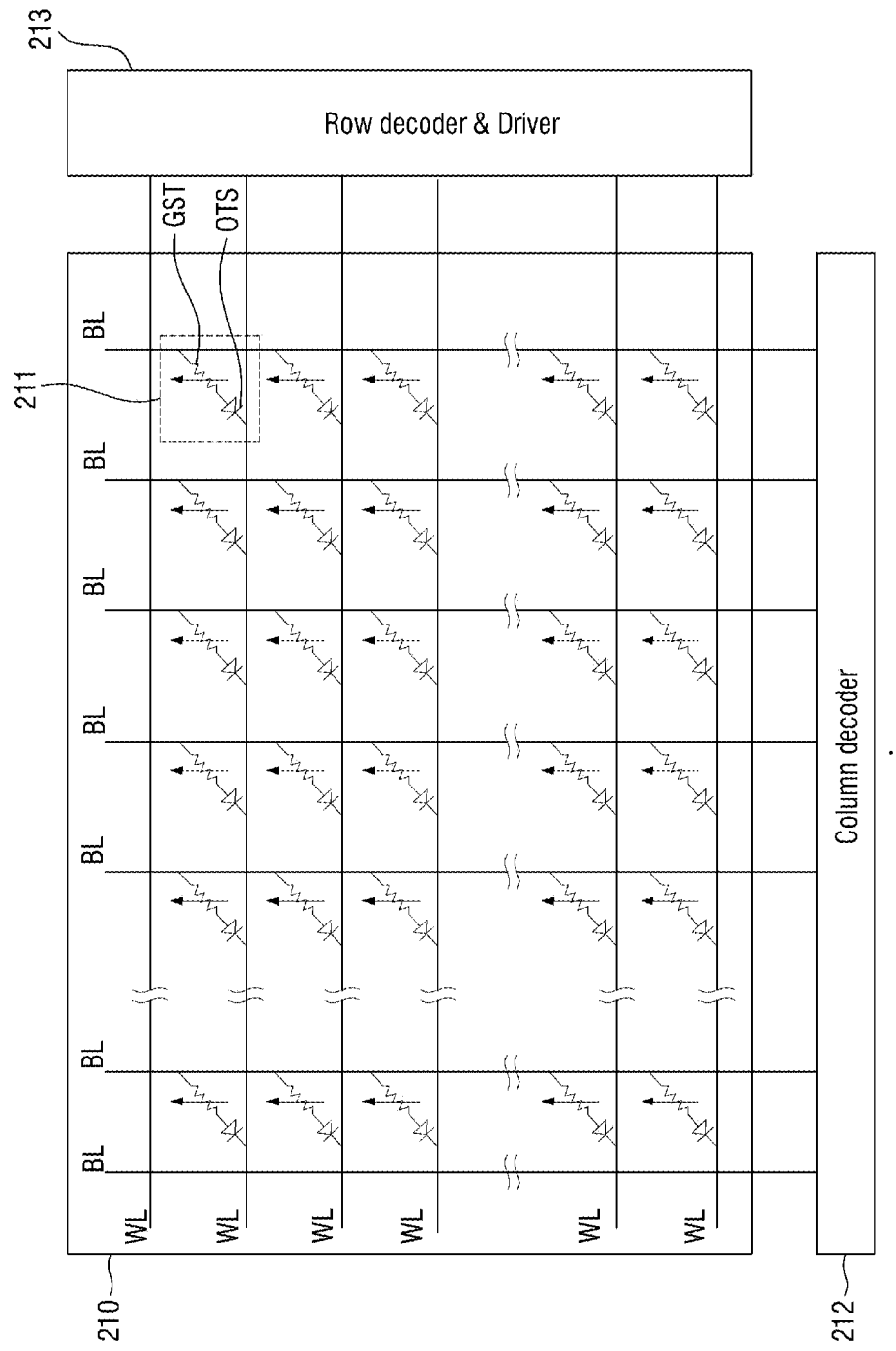
FIG. 6 is a diagram schematically showing a memory cell array in the phase change memory device according to some example embodiments.

FIG. 5 is a block diagram schematically showing a phase change memory device according to some example embodiments. FIG. 6 is a diagram schematically showing a memory cell array in the phase change memory device according to some example embodiments.

Referring to FIGS. 5 and 6, the memory device according to at least one example embodiment of the present inventive concepts may include a memory cell array 210, a column decoder 212, a row decoder and driver 213, a write driver 214, a sensing circuitry 215, an address register 216, and/or control logic circuitry 220, but the example embodiments are not limited thereto and may include a greater or lesser number of constituent elements.

The memory device 200 may be implemented as only a memory cell array of a single layer, and may also be implemented by stacking a plurality of memory cell arrays three-dimensionally, but the example embodiments are not limited thereto. The memory cell array 210 may include a single memory cell 211 connected to a single word line WL selected on the basis of a row address XADD, and a single bit line BL selected on the basis of a column address YADD, etc.

Each of the memory cells 211 may include a variable resistance element GST including a phase change material, and an access element OTS for controlling a current flowing through the variable resistance element GST, etc.

For the phase change material of the memory cells, for example, it is possible to use various kinds of materials such as, GaSb, InSb, InSe, Sb2Te3, and/or GeTe, etc., obtained by combining two elements, GeSbTe, GaSeTe, InSbTe, SnSb2Te4, and/or InSbGe, etc., obtained by combining three elements, and/or AgInSbTe, (GeSn)SbTe, GeSb(SeTe), Te81Ge15Sb2S2, etc., obtained by combining four elements, however the example embodiments are not limited thereto.

In some example embodiments, GeSbTe including germanium (Ge), antimony (Sb), and tellurium (Te) may be used as the phase change material, however the example embodiments are not limited thereto. The access element OTS may be a diode and/or a transistor (not shown) connected in series with the variable resistance element GST, etc.

In the case of RRAM, the variable resistance element GST may include a complex metal oxide, etc. If the resistive memory cell RMC is an RRAM, the resistive memory cell RMC may include, for example, NiO, perovskite, etc. A filament may be formed in the variable resistance element GST, and the filament may be a current path of a cell current flowing through the memory cell. In some example embodiments, if the memory cell RMC is an RRAM, the access element that controls the current flowing through the variable resistance element GST may be omitted.

In the case of the MRAM, the variable resistance element GST may include a magnetic upper electrode, a magnetic lower electrode, and/or a dielectric, etc. therebetween.

The memory cell array 210 may be divided into a plurality of memory blocks BLK, and each of the memory blocks may be divided into a plurality of memory banks and a plurality of memory pages, etc.

Further, the memory cell array 210 includes a plurality of memory units (e.g., a memory set, such as a set of memory blocks, memory banks, memory pages, word lines, codewords, etc.) to be partially refreshed, which will be described below in at least one example embodiment of the present inventive concepts. That is, in at least one example embodiment of the present inventive concepts, the refresh operation may be performed on the memory unit (e.g., memory set, set of memory units, etc.) by deciding in the units of the memory unit. The memory unit may be divided in units of memory blocks, memory banks, memory pages, word lines, and/or codewords, etc., and/or may be set by grouping them in plurality.

The column decoder 212 may decode the column address YADD which is output from the address register 216, and select at least one bit line (or column) from the plurality of bit lines BL.

The row decoder and driver 213 may decode the row address which is output from the address register 216, and select at least one word line (or row) from the plurality of word lines WL. The write driver 214 may write data on a memory cell selected by the column decoder 212, the row decoder, and the driver 213.

The sensing circuitry 215 may perform a read operation for sensing (e.g., reading) the data stored in the memory cell 211, and a verify read operation for detecting an error of data (e.g., detect an error in data written in the memory cell, etc.) at the time of sensing. At the time of the sensing operation according to some example embodiments, data stored in the memory cell 211 may be sensed in units of codeword, but are not limited thereto. According to at least one example embodiment, the sensing circuitry 215 may be processing circuitry may include hardware including logic circuits; a hardware/software combination such as at least one processor executing software; or a combination thereof. Additionally, the sensing circuitry 215 may be separate from, or included with, the control logic circuitry 220.

The codeword may include a data bit and an error correction code (ECC) bit, but is not limited thereto. At the time of the codeword sensing, a function of correcting errors in some memory cells corresponding to the codeword using the ECC bit may be performed. The ECC bits may include an RS code (Reed-Solomon code) bit, a Hamming code bit, a BCH (Bose-Chaudhuri-Hocquenghem) code bit, a CRC (Cyclic Redundancy Code) bit, and the like. However, the ECC code according to the example embodiments are not limited thereto.

However, the number of error bits capable of being corrected using ECC bits is limited. For example, it is possible to pass the sensing by correcting errors of up to 10 bits in one codeword using the specific ECC bits. When an error of 10 bits or more occurs, the error of the codeword may not be corrected, and the sensing of the sensing circuitry 215 on the codeword may fail to pass and/or fail to correctly read the data of the codeword.

As described above, when the drift phenomenon occurs and the voltage dispersion of the memory cells 211 included in the codeword increases, a data error of the plurality of memory cells occurs, and the sensing on the codeword may fail to pass and/or fail to fail to correctly read the data of the memory cells 211. In addition, depending on the type of the ECC bit and/or the number of ECC bits included in the memory cells 211, not only the number of erroneous bits but also the position of erroneous bits in the codeword may affect the codeword sensing pass/fail (e.g., correct reading or failed reading).

The control logic circuitry 220 may include a refresh controller 221, a setting circuitry 222, a correction circuitry 223, a request circuitry 224 and a detection circuitry 225. The control logic circuitry 220 may be processing circuitry and may include hardware including logic circuits; a hardware/software combination such as at least one processor executing software; or a combination thereof. For example, the control logic circuitry 220 more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. Additionally, the refresh controller 221, setting circuitry 222, correction circuitry 223, request circuitry 224 and detection circuitry 225, etc., may also include hardware including logic circuits; a hardware/software combination such as at least one processor executing software; or a combination thereof, or may be integrated within the control logic circuitry and/or may be special purpose programming executed by the control logic circuitry 220.

The refresh controller 221 may perform a refresh operation on a specific memory unit in the memory cell array 210. The setting circuitry 222 may specify a part of the memory cell array 210 by a method desired and/or predetermined by the user, and decide it as a memory unit. The correction circuitry 223 may correct the sensing voltage for sensing the memory cell 211 in consideration of the voltage dispersion of the memory cell.

The request circuitry 224 may issue a chip refresh operation request to the host 100 through the bus 300 of FIG. 4, and/or transfer the state of a memory cell or a memory unit to the host via the bus 300. The detection circuitry 225 may determine whether a sensing voltage is equal to and/or higher than a reference voltage, which will be described below.

Figure 7:
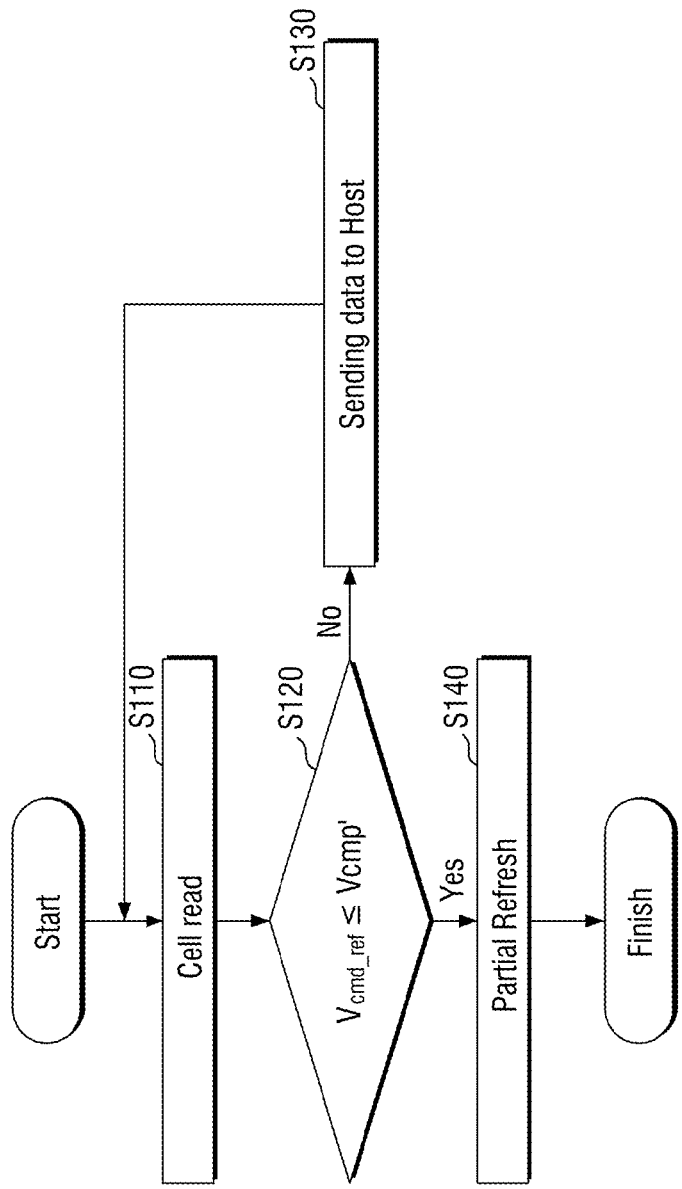
FIG. 7 is a flowchart for explaining a refresh operation of the phase change memory device according to some example embodiments.

FIG. 7 is a flow chart for explaining a refresh operation of a phase change memory device according to some example embodiments. Referring to FIGS. 4, 5 and 7, the sensing circuitry 215 reads data of a codeword of a memory cell of an address transmitted to the address register 216 (S110). The memory cell read operation of the sensing circuitry 215 will be described below in detail with reference to FIGS. 9 to 11.

The detection circuitry 225 determines whether a common intermediate point Vcmp' of the voltage dispersion of the memory cell is higher than a reference voltage Vcmd_ref desired and/or predetermined by the user (S120).

Figure 8:
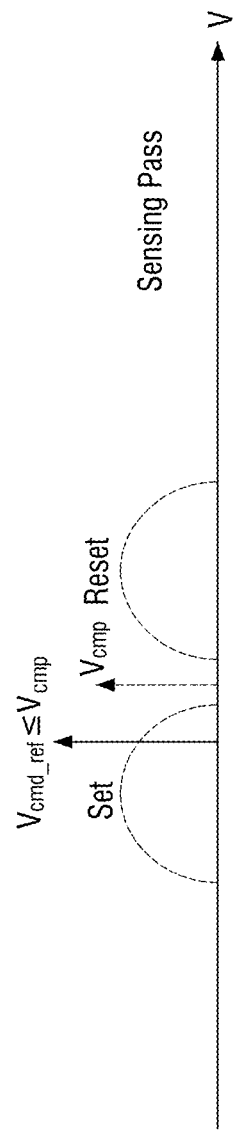
FIG. 8 is a diagram for explaining conditions for executing a partial refresh operation according to some example embodiments.

FIG. 8 is a diagram for explaining conditions for performing (S140) a partial refresh operation according to some example embodiments.

Additionally referring to FIG. 8, when the detection circuitry 225 determines that the common intermediate point Vcmp of the voltage dispersion of the memory cell is smaller (e.g., lower) than a reference voltage Vcmd_ref desired and/or predetermined by the user, the request circuitry 224 transfers the state of the memory cell to the host 100 (S130).

After transferring data to the host, the detection circuitry 225 may execute an operation (S110) of reading the data of the codeword including the memory cell of the address transferred to the address register 216, and may repeat this operation until the common intermediate point Vcmp of the voltage dispersion of the memory cell is determined to be greater than the reference voltage Vcmd_ref desired and/or predetermined by the user.

If the detection circuitry 225 determines that the common intermediate point Vcmp of the voltage dispersion of the memory cell is higher than the reference voltage Vcmd_ref desired and/or predetermined by the user, the memory device 200 performs the partial refresh operation (S140). The partial refresh operation will be described below in the detailed description of FIGS. 12 to 18.

Figure 9:
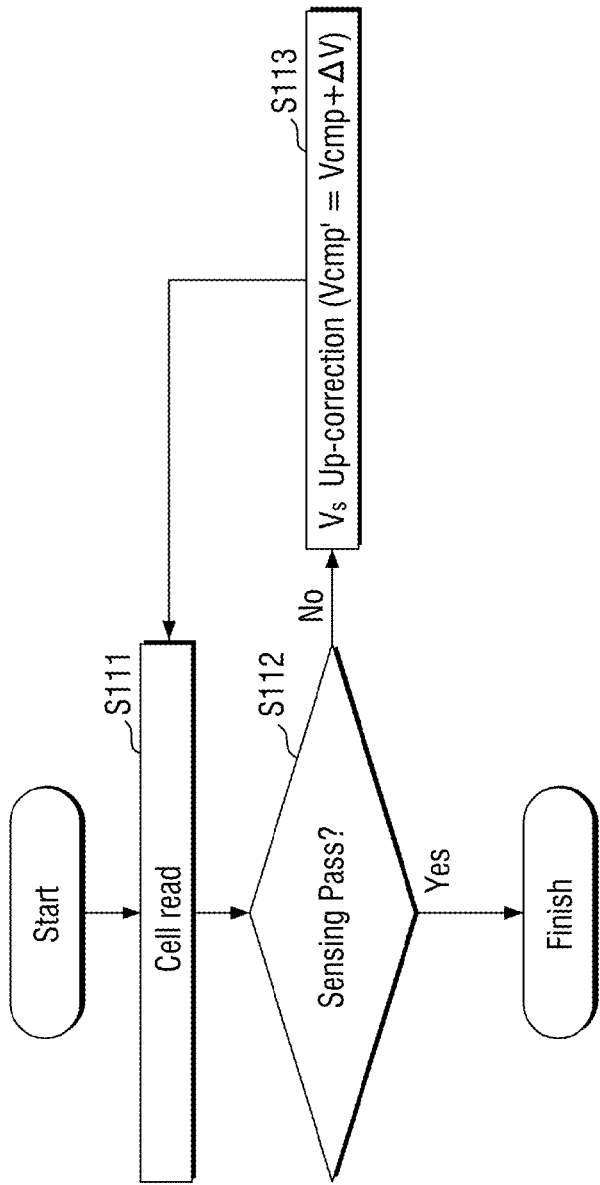
FIG. 9 is a flowchart showing a memory cell read operation according to some example embodiments.

FIG. 9 is a flowchart for explaining a memory cell read operation according to some example embodiments.

Figure 10:
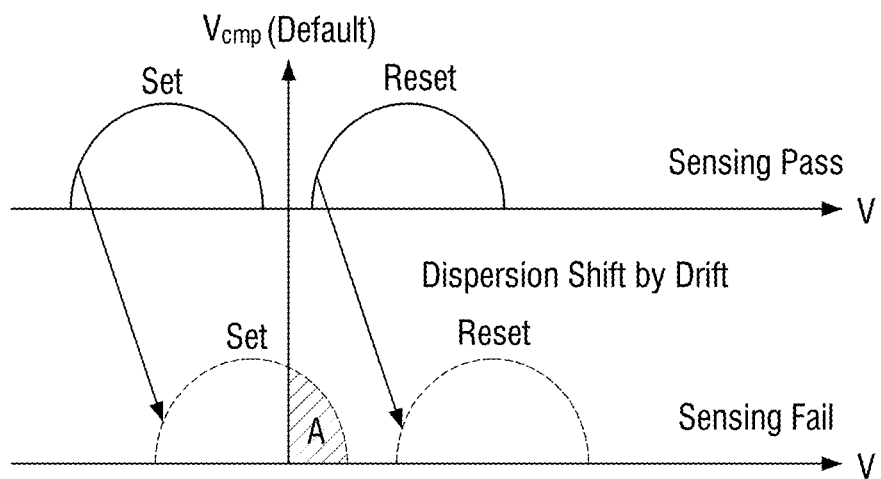
FIG. 10 is a diagram for explaining the memory cell read operation according to some example embodiments.

FIG. 10 is a diagram for explaining the memory cell read operation according to some example embodiments.

Figure 11:
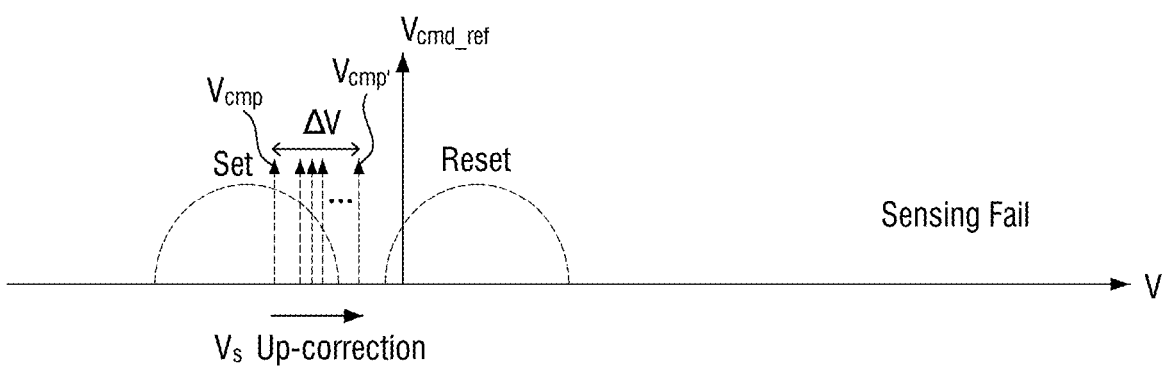
FIG. 11 is a diagram for explaining correction of a sensing voltage according to some example embodiments.

FIG. 11 is a diagram for explaining correction of a sensing voltage according to some example embodiments.

Referring to FIGS. 5 and 9 to 11, the sensing circuitry 215 reads the data of the codeword on the memory cell (S111).

After the read operation of sensing the data, the sensing circuitry 215 determines whether there is an error in the sensed data on the codeword (S112).

As an example of the data of the determination, the sensing circuitry 215 may consider that the codeword passes the sensing (e.g., Sensing Pass, correctly reads the data, etc.), when the voltage applied to the memory cell is smaller than the sensing voltage (e.g., Vcmp(Default) of FIG. 10) during a state in which the memory cell in the codeword is sensed to indicate the set data, and the voltage applied to the memory cell is greater than the sensing voltage during a state in which the memory cell is sensed to indicate the reset data.

The sensing circuitry 215 may not pass the sensing of (e.g., fail reading, etc.) the codeword corresponding to the memory cell, when a dispersion A value greater than the sensing voltage (Vcmp(Default) of FIG. 10) exists in the voltage applied to a part of the memory cells, during a state in which a plurality of memory cells exceeding the maximum number of error correction bits in the codeword is sensed to indicate a set data, or when a dispersion smaller than the sensing voltage (Vcmp(Default) of FIG. 9) exists in the voltage applied to the memory cell during a state in which the memory cell is sensed to indicate the reset data (e.g., Sensing Fail, etc.).

If the sensing circuitry 215 determines that there is an error in the read operation of the codeword, it performs correction of the sensing voltage Vs (S113).

When FIG. 11 is considered as an example of some example embodiments, if the common intermediate point Vcmp before the change in the voltage dispersion changes by ΔV with a change in the voltage dispersion in the memory cell, the sensing circuitry 215 may fail to pass the sensing of the codeword (e.g., Sensing Fail, etc.).

If it fails to pass sensing, an upward correction of making the sensing voltage (e.g., increasing the sensing voltage, etc.) of the memory cell in the codeword equivalent to upward common intermediate point Vcmp' may be performed according to at least one example embodiment.

The correction circuitry 223 may perform a correction of making the common intermediate point Vcmp' changed according to Formula 1 equivalent to the sensing voltage Vs as follows.

$$Vcmp' = Vcmp + \Delta V \quad \text{[Formula 1]}$$

When the voltage dispersion of the memory cell moves to the right (e.g., the voltage increases), the common intermediate point moves from Vcmp to Vcmp', and the sensing voltage Vs may also be corrected upward (e.g., may increase) accordingly.

Figure 12:
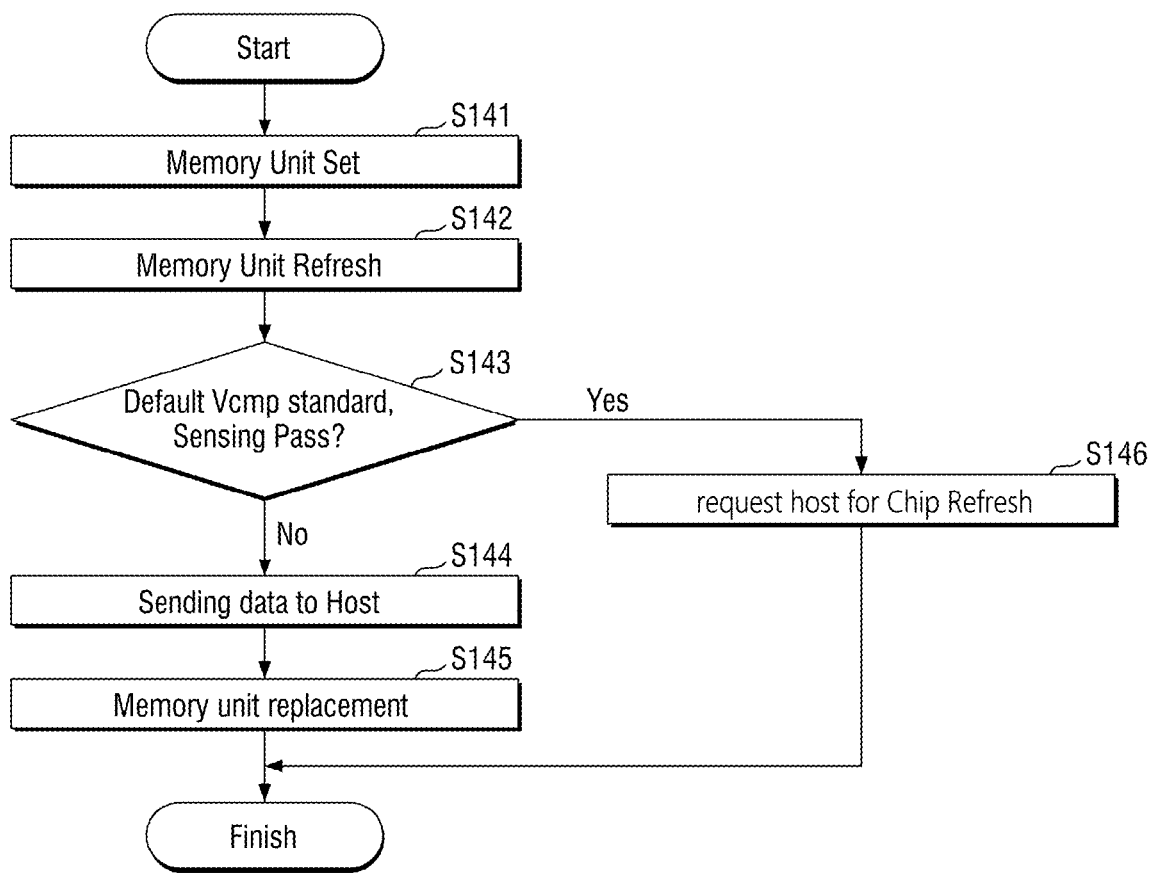
FIG. 12 is a flowchart showing a partial refresh operation according to some example embodiments.

FIG. 12 is a flowchart for explaining a partial refresh operation according to some example embodiments.

Referring to FIGS. 2 and 12, the setting circuitry 222 may decide (e.g., set, designate, etc.) a memory unit present in the memory cell array 210 (S141). The setting circuitry 222 may set, designate, and/or decide the memory unit by sampling a plurality of memory cells in the memory cell array 210, while including the memory cell which satisfies the condition in operation S120 of FIG. 8.

A deciding manner of a memory unit to be partially refreshed is performed by a manner specified by a user in advance, and the setting circuitry 222 may decide one of a plurality of memory units included in the memory cell array 210.

Figure 13:
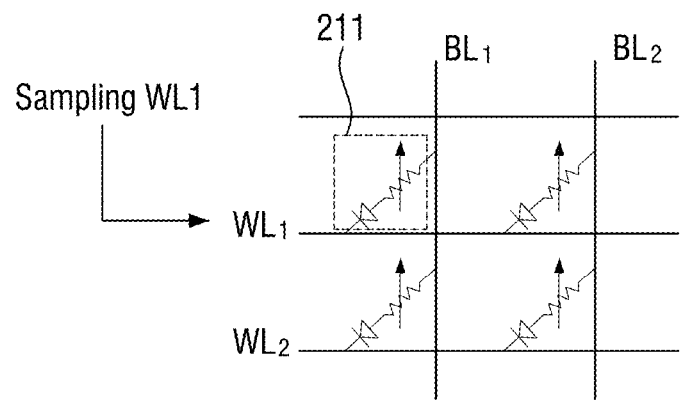
FIG. 13 is a diagram for explaining an example of a memory unit decision according to some example embodiments.

FIG. 13 is a diagram for explaining an example of a memory unit decision according to some example embodiments. Referring further to FIG. 13, the setting circuitry 222 may decide a single memory unit, by sampling the memory cells connected to the word line WL1 including the memory cell 211 which has performed the operation S120 of FIG. 7. The memory cells may be configured in units of codewords, but the example embodiments are not limited thereto and other units of memory may be used.

Figure 14:
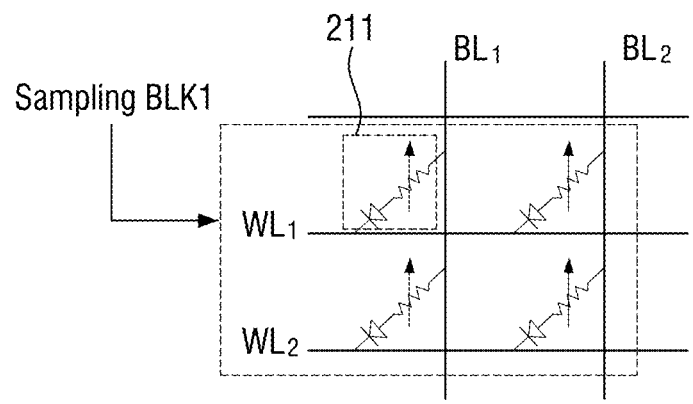
FIG. 14 is a diagram showing an example of a memory unit decision according to some example embodiments.

FIG. 14 is a diagram showing an example of a memory unit decision according to some example embodiments. Referring to FIG. 14, the setting circuitry 222 may sample the memory cells connected to the blocks WL1, WL2, BL1 and BL2, etc., including the memory cell 211 that has performed the operation S120 of FIG. 7 and decide them (e.g., set them, designate them, etc.) as a single memory unit, but the example embodiments are not limited thereto.

In addition to the aforementioned example embodiments, the memory unit may be decided by sampling in units of one or more memory pages, and/or the memory unit may be decided by sampling in units of one or more memory banks, etc., but the example embodiments are not limited thereto.

The memory unit may be decided by sampling in units of one or more error correction units of the codeword in which data bits are 256 or less, but the example embodiments are not limited thereto. Therefore, since sampling and refreshing may be performed in units that may be corrected by the error correction code, the possibility of error occurrence of sensing may be further reduced. In other words, the size of the memory unit of a sampling operation and/or a refresh operation may be set based on a desired and/or maximum memory size for a successful error correction operation of the memory device.

In addition, it is possible to decide (e.g., set, determine, allocate, etc.) a memory unit by including a partial memory region desired and/or predefined in the memory device 200 without performing the sampling operation.

The refresh controller 221 may perform a refresh operation for initializing the voltage dispersion of the decided (S141) memory unit (S142). After performing the refresh operation (S142), the sensing circuitry 215 detects whether an error occurs in the sensing operation on the basis of a common intermediate point Vcmp(Default) of the initial voltage dispersion of the memory cell (S143), etc.

Figure 15:
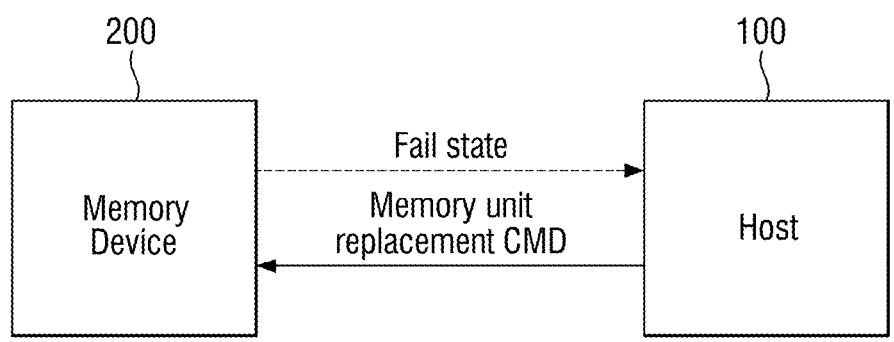
FIG. 15 is a diagram showing a memory unit substitution operation according to some example embodiments.

FIG. 15 is a diagram for explaining a memory unit substitution operation according to some example embodiments. Referring further to FIG. 15, the sensing circuitry 215 may determine a sensing error on the basis of the common intermediate point Vcmp(Default).

If a plurality of codewords of a desired and/or predetermined ratio or more in a memory unit fails to pass the sensing (e.g., the sensing operation has failed and/or is unsuccessful, etc.), since the memory device 200 may not determine that a change in the voltage dispersion of the memory cell has occurred due to the drift, the request circuitry 224 transmits the data of the memory unit to the host 100 (S144). Even if one codeword in a memory unit fails to pass the sensing, the request circuitry according to some other example embodiments may transmit the data of the memory unit to the host. In other words, the sensing circuitry 215 may determine a ratio of memory units (and/or sub-units of the memory unit) that pass the sensing operation. Based on a comparison of the determined ratio and a desired sensing operation ratio threshold value, the request circuitry transmits the read data to the host or requests a partial or full refresh operation.

In addition to the drift, change factors of the voltage dispersion of the memory cell may be determined as factors such as a physical crack and/or disconnection of the phase change material in the memory cell and/or the thin film in the memory cell.

Therefore, the host 100 may transmit a command (e.g., Memory unit replacement CMD, etc.), which replaces the function and/or operation of the memory unit with another memory unit in the memory device 200 to the memory device 200 (S145).

Figure 16:
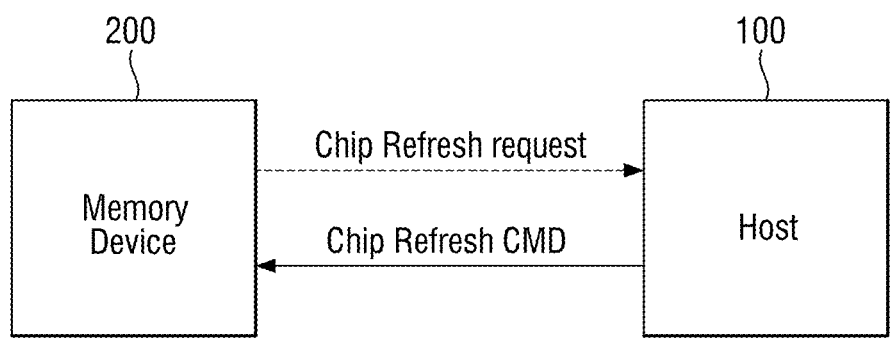
FIG. 16 is a diagram for explaining a chip refresh request operation according to some example embodiments.

FIG. 16 is a diagram for explaining a chip refresh request operation according to some example embodiments. Referring further to FIG. 16, the sensing circuitry 215 may determine a sensing error on the basis of the common intermediate point V-cmp(Default).

If the codeword of a desired and/or predetermined ratio or more in the memory unit passes the sensing operation (e.g., if a desired number of codewords of the total number of codewords in the memory unit passes the sensing operation, etc.), the memory device 200 may determine that the change in the voltage dispersion of the memory cell occurred due to the drift. As an example, if all of the codewords in the memory unit pass the sensing operation, the memory device 200 may similarly determine that the change in the voltage dispersion of the memory cell has occurred due to the drift. Therefore, the request circuitry 224 requests the host 100 for a chip refresh operation for refreshing the entire memory cell arrays 210 (S146). A refresh command CMD is transmitted to the memory device 200 in accordance with the host chip refresh request.

Figure 17:
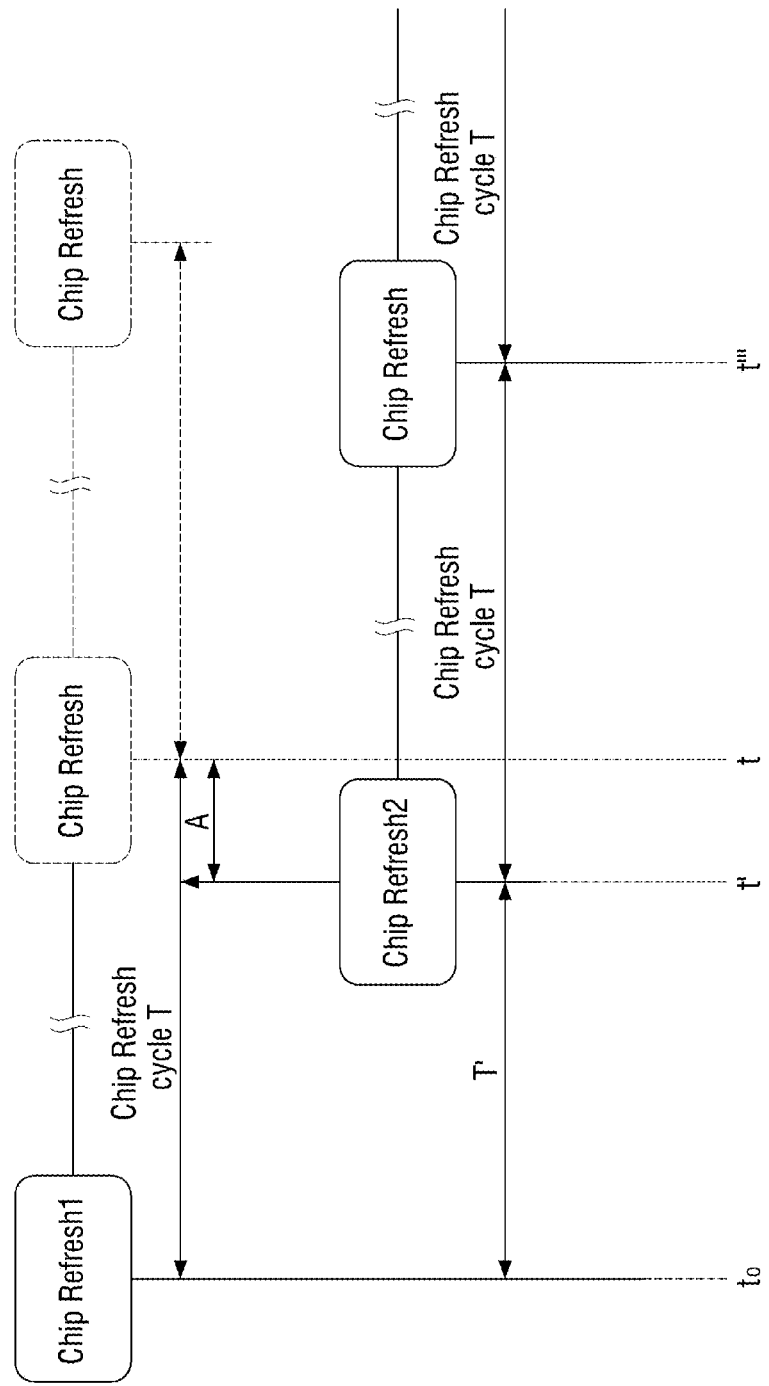
FIG. 17 is a diagram for explaining effects of the memory system according to some example embodiments.

FIG. 17 is a diagram for explaining an effect of the phase change memory system according to some example embodiments.

Referring to FIGS. 4, 5, and 17, a memory device 200 according to some example embodiments may perform a chip refresh operation on the entire memory cell arrays 210 with a cycle T.

In the phase change memory system according to some example embodiments, the sensing circuitry 215 and the control logic circuitry 220 operate at a timing t' that is shorter than the cycle T by the time A after an arbitrary chip refresh operation 1 and a chip refresh operation 2 is performed. Thus, in the section [t', t], it is possible to reduce and/or prevent an occurrence of error in the data sensing of the codeword of the memory cell due to the drift in the memory cells in the memory device 200. The possibility of error occurrence of the operation of the memory device 200 may be reduced. The chip refresh operation 2 is performed at t', and the chip refresh operation may be performed at the recycle T starting from the chip refresh. Thereafter, a chip refresh operation may be performed at t''' after T time from t'.

In a phase change memory system according to some other example embodiments, since the time A is smaller than half of the cycle T, after the chip refresh operation 1 is initially performed after the power-up of the memory device 200, the sensing circuitry 215 and the control logic circuitry 220 operate at t' shorter than the cycle T by a fixed time A, and a chip refresh operation 2 may be performed.

In a phase change memory system according to some other example embodiments, the time A is smaller than half of the cycle T, after the half of the cycle T has passed, the sensing circuitry 215, the refresh controller 221, the setting circuitry 222, the correction circuitry 223, and the request circuitry 224 operate, and a chip refresh operation 2 may be performed at t'.

In concluding the detailed description, those of ordinary skill in the art will appreciate that many variations and modifications may be made to the example embodiments without substantially departing from the principles of the present inventive concepts. Therefore, the disclosed example embodiments of the inventive concepts are used in a generic and descriptive sense only and not for purposes of limitation.

What is claimed is:

1. A phase change memory system comprising:
a phase change memory controller configured to perform a chip refresh operation for refreshing a phase change memory device; and
the phase change memory device including a plurality of memory cells of at least one or more codewords, the phase change memory device including control logic circuitry configured to,
determine a memory unit including at least one codeword in the plurality of memory cells,
perform a refresh operation on the determined memory unit,
perform a sensing operation on data of the memory unit,
determine whether the sensing operation was successful based on a sensing voltage of the sensing operation, a desired reference voltage, and a result of the sensing operation, and
request the chip refresh operation to a host based on a result of determining whether the sensing operation was successful.

2. The phase change memory system of claim 1, wherein the control logic circuitry is further configured to:
determine a ratio of codewords of the memory unit which successfully pass the sensing operation;
request the chip refresh operation based on the determined ratio of the memory unit and a desired threshold value; and
transmit information corresponding to the memory unit to the host, in response to the determined ratio being less than the desired threshold value.

3. The phase change memory system of claim 2, wherein the control logic circuitry is further configured to:
increase the sensing voltage of the at least one codeword of the memory unit in response to the determining ratio being less than the desired threshold value.

4. The phase change memory system of claim 3, wherein the phase change memory controller is further configured to:
perform the chip refresh operation based on a desired cycle; and
after performing the chip refresh operation, and before a next cycle of the desired cycle arrives, the phase change memory controller is configured to control the control logic circuitry to perform the determining the memory unit, the performing the refresh operation, performing the sensing operation, and the requesting the chip refresh operation again.

5. The phase change memory system of claim 4, wherein a size of the memory unit is based on any one of a plurality of pages, a wordline, a memory bank, or a memory block.

6. The phase change memory system of claim 4, wherein the memory unit includes codewords having a data bit of 256 bits or less.

7. The phase change memory system of claim 3, wherein after the phase change memory device is powered up and a first chip refresh operation is performed,
the control logic circuitry is further configured to operate after passage of a desired amount of time.

8. The phase change memory system of claim 1, wherein the phase change memory controller is further configured to perform the chip refresh operation based on a desired cycle, and
after the chip refresh operation is performed, the control logic circuitry is further configured to operate after a half of the cycle passes and before a next cycle arrives.

9. The phase change memory system of claim 1, wherein the control logic circuitry is further configured to:
determine whether the sensing voltage is equal to or higher than the desired reference voltage; and
increase the sensing voltage in response to the sensing voltage being less than the desired reference voltage.

10. The phase change memory system of claim 1, wherein the control logic circuitry is further configured to:
transmit information of the memory unit to a host, in response to any one of the at least one or more codewords of the memory unit failing the sensing operation; and
request the chip refresh operation in response to all of the at least one codeword of the memory unit successfully pass the sensing operation to the host.

11. The phase change memory system of claim 1, wherein the control logic circuitry is further configured to set a partial memory region of the memory unit without performing a sampling operation.

12. A method of refreshing a phase change memory device, the method comprising:
determining, using control logic circuitry, a memory unit including a plurality of codewords in a plurality of memory cells of a phase change memory device;
performing, using the control logic circuitry, a refresh operation on the memory unit based on a sensing voltage for reading data stored in a first codeword of the plurality of codewords and a desired reference voltage;
performing, using the control logic circuitry, a sensing operation on data of the plurality of codewords included in the memory unit;
determining, using the control logic circuity, whether the sensing operation was successful based on the sensing voltage of the sensing operation, the desired reference voltage, and a result of the sensing operation; and
performing, using the control logic circuitry, a refresh operation on the entire phase change memory device based on a result of the determining whether the sensing operation was successful.

13. The method of refreshing the phase change memory device of claim 12, wherein, based on the result of the sensing operation:
performing, using the control logic circuitry, the refresh operation on the entire phase change memory device in response to a ratio of the plurality of codewords of the memory unit successfully passing the sensing operation being greater than or equal to a desired threshold value; and
transmitting, using the control logic circuitry, information of the memory unit to a host in response to the ratio of the plurality of codewords of the memory being less than the desired threshold value.

14. The method of refreshing the phase change memory device of claim 13, further comprising:
increasing the sensing voltage corresponding to the first codeword in accordance with a changed voltage dispersion in response to the first codeword failing the sensing operation.

15. The method of refreshing the phase change memory device of claim 14, wherein the plurality of codewords of the memory unit have a size of 256 bits or less.

16. The method of refreshing the phase change memory device of claim 12, wherein, based on the result of the sensing operation:
transmitting, using the control logic circuitry, information of the memory unit in response to at least one codeword of the plurality of codewords of the memory unit failing the sensing operation; and
performing, using the control logic circuitry, a refresh operation in response to all of the codewords of the memory unit passing the sensing operation.

17. A phase change memory system comprising:
a phase change memory cell array including at least one codeword;
a host including a phase change memory controller configured to perform a chip refresh operation for refreshing the entire phase change memory cell array; and
control logic circuitry configured to,
sense data of the at least one codeword of the phase change memory cell array,
determine whether the sensing was successful based on a sensing voltage used in the sensing, a desired reference voltage, and a result of the sensing, and
transmit a request the chip refresh operation to the host based on a result of the determining whether the sensing was successful.

18. The phase change memory system of claim 17, wherein the control logic circuitry is further configured to:
transmit the request for the chip refresh operation in response to a ratio of the at least one codeword of a memory unit successfully passing the sensing being greater than a desired threshold value; and
transmit information of the memory unit to the host in response to the ratio of the at least one codeword being less than or equal to the desired threshold value.

19. The phase change memory system of claim 18, wherein
the phase change memory controller is configured to perform the chip refresh operation based on a desired cycle; and
after the chip refresh operation is performed, and before a next cycle of the desired cycle arrives, the control logic circuitry is further configured to operate.

20. The phase change memory system of claim 18, wherein the at least one codeword has a size of 256 bits or less.

* * * * *